United States Patent
He

(10) Patent No.: US 9,893,252 B2
(45) Date of Patent: Feb. 13, 2018

(54) WHITE LED, BACKLIGHT MODULE AND LIQUID CRYSTAL DISPLAY DEVICE

(71) Applicant: Shenzhen China Star Optoelectronics Technology Co., Ltd., Guangdong (CN)

(72) Inventor: Hu He, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 59 days.

(21) Appl. No.: 14/888,644

(22) PCT Filed: Apr. 29, 2015

(86) PCT No.: PCT/CN2015/077833
§ 371 (c)(1),
(2) Date: Nov. 2, 2015

(87) PCT Pub. No.: WO2016/138693
PCT Pub. Date: Sep. 9, 2016

(65) Prior Publication Data
US 2016/0380170 A1    Dec. 29, 2016

(30) Foreign Application Priority Data
Mar. 3, 2015  (CN) .......................... 2015 1 0095571

(51) Int. Cl.
*G02F 1/1335*    (2006.01)
*H01L 33/60*     (2010.01)
(Continued)

(52) U.S. Cl.
CPC ............ *H01L 33/60* (2013.01); *G02B 6/0073* (2013.01); *H01L 33/504* (2013.01);
(Continued)

(58) Field of Classification Search
CPC .......................................... G02F 2001/133614
See application file for complete search history.

(56) References Cited

U.S. PATENT DOCUMENTS

2005/0056858 A1  3/2005  Kakiuchi et al.
2014/0153217 A1*  6/2014  Kang .................. G02B 5/23
                                                    362/84
(Continued)

FOREIGN PATENT DOCUMENTS

CN    201526868    7/2010
CN    101806404    8/2010
(Continued)

OTHER PUBLICATIONS

International Search Report for PCT/CN2015/077833, English translation attached to original, Both completed by the Chinese Patent Office dated Nov. 2, 2015, All together 6 Pages.

*Primary Examiner* — Kendrick Hsu
(74) *Attorney, Agent, or Firm* — Mintz Levin Cohn Ferris Glovsky and Popeo, P.C.; Kongsik Kim

(57) ABSTRACT

A white LED, which includes a substrate, at least one monochromatic LED chip disposed on the substrate, a reflector cup disposed on the substrate and surrounding the monochromatic LED chip, an encapsulating colloid filled in the reflector cup to seal the monochromatic LED chip, and a first quantum dot structure and a second quantum dot structure sealed in the encapsulating colloid, and light generated by the monochromatic LED chip, light generated by exciting the first quantum dot structure and light generated by exciting the second quantum dot structure are mixed to form a white light. A backlight module having the white LED and a liquid crystal display device having the backlight module is also disclosed.

12 Claims, 2 Drawing Sheets

(51) Int. Cl.
*F21V 8/00*    (2006.01)
*H01L 33/50*   (2010.01)
*H01L 33/54*   (2010.01)
*H01L 33/56*   (2010.01)

(52) U.S. Cl.
CPC ............ H01L 33/507 (2013.01); H01L 33/54 (2013.01); H01L 33/56 (2013.01); *G02F 2001/133614* (2013.01)

(56) References Cited

U.S. PATENT DOCUMENTS

| | | | |
|---|---|---|---|
| 2015/0153594 A1 | 6/2015 | Sato | |
| 2015/0197689 A1* | 7/2015 | Tani | C09K 11/025 362/84 |
| 2016/0186960 A1* | 6/2016 | Kim | G02F 1/133514 349/71 |

FOREIGN PATENT DOCUMENTS

| | | |
|---|---|---|
| CN | 102509759 | 6/2012 |
| CN | 202955581 | 5/2013 |
| CN | 104062807 | 9/2014 |
| CN | 104335107 | 2/2015 |
| EP | 2354631 | 8/2011 |
| JP | 2005091675 | 4/2005 |

\* cited by examiner

WHITE LED, BACKLIGHT MODULE AND LIQUID CRYSTAL DISPLAY DEVICE

CROSS-REFERENCE TO RELATED APPLICATION

This application is the U.S. national phase of PCT Application No. PCT/CN15/077833 filed on Apr. 29, 2015, which claims priority to CN Patent Application No. 201510095571.2 filed on Mar. 3, 2015, the disclosures of which are incorporated in their entirety by reference herein.

TECHNICAL FIELD

The present invention relates to a white LED, a backlight module and a liquid crystal display device.

BACKGROUND ART

A white Light Emitting Diode (LED) is usually used as a backlight light source in a conventional liquid crystal display device, and generates a backlight for a liquid crystal display panel through a proper combination of a light guide plate and an optical film. With a growing demand for high color gamut, high color saturation and energy saving, the following solutions for achieving white light source, high color gamut and high color saturation in a backlight have been provided: combining an ultraviolet LED with red, green and blue phosphors; combining a blue LED with red and green phosphors; combining a blue LED, a green LED and a red LED; and the like. These solutions all can improve color gamut, but are difficult to be carried out and have a high cost.

A Quantum Dot (QD) technology is a semiconductor nanostructured material technology for bounding electrons in a certain range, and a QT is composed of ultra small compound crystals with a size of 1-100 nm. In the QT technology, crystals with different sizes can be used to control wavelength of light, thereby controlling color of light. Thus, when a QT material is applied to a backlight module, and a light source with high frequency spectrum (e.g., a blue LED) is used to substitute a typical white LED light source, the quantaum dot can be excited under a high frequency blue light source and generate light with different wavelengths. A color of the synthesized light can be adjusted by adjusting size of the quantum dot material, so that the backlight demand for high color gamut of the liquid crystal display device can be satisfied.

FIG. 1 illustrates a conventional backlight module using a quantum dot phosphor film. As shown in FIG. 1, a blue Light Emitting Diode (LED) 11 is disposed on a light incident side of a light guide plate 12, a quantum dot phosphor film 13 is disposed on a light extraction surface of the light guide plate 12, and light emitted from the blue LED 11 is converted into a surface light source through the light guide plate 12 and emitted from the light extraction surface thereof to pass through the quantum dot phosphor film 13, so that a blue light is converted into a backlight for the liquid crystal display device. However, in a liquid crystal display device having a large size, the quantum dot phosphor film 13 should be manufactured with a large area, and thus a lot of quantum dot material would be consumed, and a high coating uniformity of the quantum dot phosphor material is required, which causes a high cost. In addition, when the quantum dot phosphor film 13 is used, if the optical films have different frameworks or models, chrominance and luminance of light will vary greatly after the light improved by the optical films passes through a liquid crystal display plate, such that the framework, supplier or model of the optical film may not be easily changed during the use of the quantum dot phosphor film 13, which may greatly limit the use of the quantum dot phosphor optical film in flexibility and universality.

FIG. 2 illustrates another conventional backlight module using a quantum dot phosphor film. As shown in FIG. 2, a blue Light Emitting Diode (LED) 21 is disposed on a light incident side of a light guide plate 22, quantum dot phosphors are sealed in a glass tube to form a quantum dot phosphor glass tube 23, and the quantum dot phosphor glass tube 23 is disposed between the blue LED 21 and the light incident side of the light guide plate 22. Blue light emitted from the blue LED 21 is irradiated onto the light incident side of the light guide plate 22 through the quantum dot phosphor glass tube 23. However, in this way, the quantum dot phosphor glass tube 23 has a complex manufacturing process and a high cost, and the quantum dot phosphor glass tube 23 tends to broke.

SUMMARY

In order to solve the above problems in the related art, an object of the present invention is to provide a white LED which includes a substrate, at least one monochromatic LED chip disposed on the substrate, a reflector cup disposed on the substrate and surrounding the monochromatic LED chip, an encapsulating colloid filled in the reflector cup to seal the monochromatic LED chip and a first quantum dot structure and a second quantum dot structure sealed in the encapsulating colloid, wherein light generated by the monochromatic LED chip, light generated by exciting the first quantum dot structure and light generated by exciting the second quantum dot structure are mixed to form a white light.

Further, the monochromatic LED chip is a blue LED chip.

Further, the first quantum dot structure includes a first transparent case and a red quantum dot phosphor, and the first transparent case wraps the red quantum dot phosphor.

Further, the first transparent case is made of transparent glass material.

Further, the second quantum dot structure includes a second transparent case and a green quantum dot phosphor, and the second transparent case wraps the green quantum dot phosphor.

Further, the second transparent case is made of transparent glass material.

Further, the reflector cup is made of plastic material, and a reflective coating layer is disposed on an inner side of the reflector cup.

Further, the encapsulating colloid is made of silica gel material or epoxy resin material.

Another object of the present invention lies in providing a backlight module, which at least includes a light guide plate having a light incident side and the above white LED disposed adjacent to the light incident side.

Yet another object of the present invention also lies in providing a liquid crystal display device which includes the above backlight module and a liquid crystal display panel disposed on the backlight module.

The present invention may block water and oxygen and prevent toxic elements in the quantum dot phosphor from leaking by encapsulating the quantum dot phosphor using the glass case, thereby enhancing security. Moreover, the glass case has a small volume, and can not be broken easily and has a low fabricating cost compared with the glass tube in the related art.

BRIEF DESCRIPTION OF THE DRAWINGS

The above and/or other aspects, characteristics and advantages of the embodiments of the invention will become more apparent from the following description, taken in conjunction with the accompanying drawings in which.

DETAILED DESCRIPTION OF EXEMPLARY EMBODIMENTS

Hereinafter, embodiments of the present invention will be described in detail by referring to the accompany drawings. However, the present invention can be implemented in numerous different forms, and may not be construed as limited to the specific embodiments set forth herein. Rather, these embodiments are provided for explaining the principle and actual application of the present invention, and thus those skilled in the art can understand various embodiments and amendments which are suitable for specific intended applications of the present invention.

Figure 1:
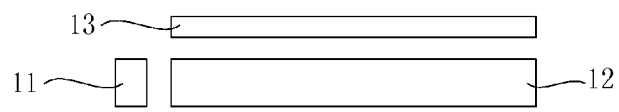
FIG. 1 illustrates a conventional backlight module using a quantum dot phosphor film.
Figure 2:
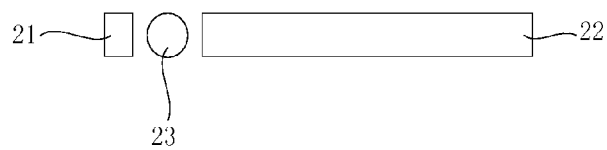
FIG. 2 illustrates another conventional backlight module using a quantum dot phosphor film.
Figure 3:
FIG. 3 is a schematic view showing a structure of a liquid crystal display device according to an embodiment of the present invention.

FIG. 3 is a schematic view showing a structure of a liquid crystal display device according to an embodiment of the present invention.

As shown in FIG. 3, the liquid crystal display device according to an exemplary embodiment of the present invention includes a liquid crystal display panel 200 and a backlight module 100 disposed opposite to the liquid crystal display panel 200, wherein the backlight module 100 provides the liquid crystal display panel 200 with a display light source, such that the liquid crystal display panel 200 displays images.

The liquid crystal display panel 200 usually includes a Thin Film Transistor (TFT) array substrate 210, a Color Filter (CF) substrate 220 disposed opposite to the TFT array substrate, and a liquid crystal layer 230 sandwiched between the TFT array substrate 210 and the CF substrate 220, wherein the liquid crystal layer 230 include several liquid crystal molecules. Since the concrete structure of the liquid crystal display panel 200 in the present embodiment is roughly the same as that of the liquid crystal display panel in the related art, detailed description thereof is not repeated herein.

The backlight module 100 according to an embodiment of the present invention includes a light guide plate 110, a white light emitting diode (LED) 120, a reflection sheet 130, a first brightening film 141 and a second brightening film 142, and a diffusion film 150. It should be understood that the number of the white LED 120 in the present invention is not limited to that shown in FIG. 3.

In particular, the light guide plate 110 includes a light incident side 111 and a light extraction surface 112. The white LED 120 is provided adjacent to the incident side 111 of the light guide plate 110. The first brightening film 141, the second brightening film 142 and the diffusion film 150 are sequentially arranged on the light extraction surface 112 of the light guide plate 110, and the first and second light brightening films 141 and 142 are used to collect the light emitted from the light extraction surface 112 so as to enhance the brightness of the light emitted from the light extraction surface 112. The diffusion film 150 enhances upward brightness of the light which is brightened by the first brightening film 141 and the second brightening film 142, and diffuses and softens the light which is brightened by the first brightening film 142 and the second brightening film 142, thereby providing a uniform surface light source to the liquid crystal display panel 200. The reflection sheet 130 is provided under the bottom surface of the light guide plate 110 to reflect the light emitted from the bottom surface of the light guide plate 110 back to the light guide plate 110, thereby increasing the utilization of the light in the light guide plate 110.

It should be explained that the backlight module 100 according to an embodiment of the present invention further includes other essential components such as a back plane, a plastic frame and the like, and a structure of conventional backlight module may be referred to for details.

Figure 4:
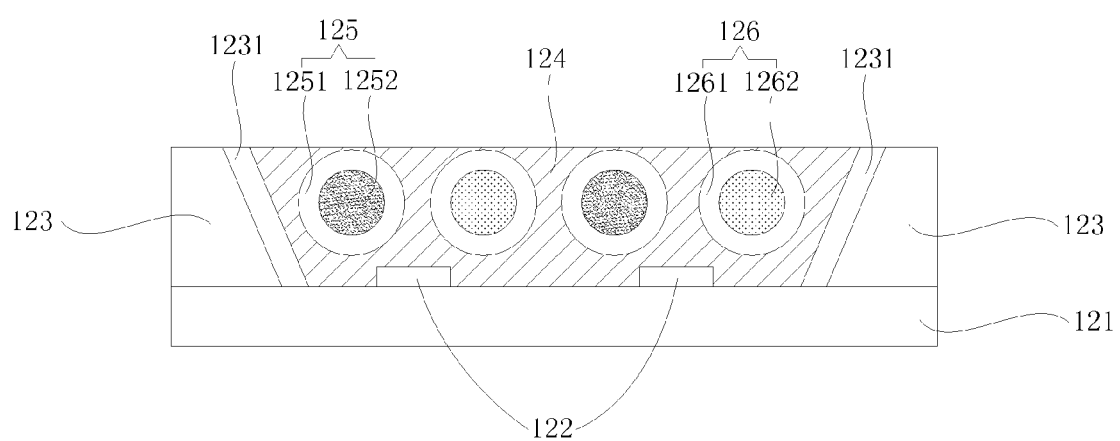
FIG. 4 is a schematic view showing a structure of a white LED according to an embodiment of the present invention.

Hereinafter, a white LED 120 according to an embodiment of the present invention will be described in details by referring to FIG. 4. FIG. 4 is a schematic view showing a structure of a white LED according to an embodiment of the present invention.

Referring to FIG. 4, the white LED 120 according to an embodiment of the present invention includes a substrate 121, two monochromatic LED chips 122, a reflector cup 123, an encapsulating colloid 124, a first quantum dot structure 125 and a second quantum dot structure 126. It should be understood that the number of the monochromatic LED chip 122 in the present invention is not limited to that shown in FIG. 4.

In particular, two monochromatic LED chips 122 are disposed on the substrate 121, and connected with each other in series by a bonding wire (not shown). Here, the monochromatic LED chip indicates that the LED chip only generates a light of single color. The reflector cup 123 is disposed on the substrate 121 and surrounds the two monochromatic LEDs 122, such that the light generated by the two monochromatic LEDs 122 exits toward the front surfaces of the two monochromatic LEDs 122, thereby increasing the utilization of the light generated by the two monochromatic LEDs 122. The encapsulating colloid 124 is filled in the reflector cup 123 to seal the two monochromatic LEDs 122. The first quantum dot structure 125 and the second quantum dot structure 126 are both sealed in the encapsulating colloid 124, and the light generated by the two monochromatic LEDs 122, the light generated after the first quantum dot structure 125 is excited and the light generated after the second quantum dot structure 126 is excited are mixed to form white light. Here, the light generated after the first quantum dot structure 125 is excited refers to the light generated by exciting the quantum dot material in the first quantum dot structure 125 using the light generated by the two monochromatic LEDs 122, and similarly, the light generated after the second quantum dot structure 126 is excited refers to the light generated by exciting the quantum dot material in the second quantum dot structure 126 using the light generated by the two monochromatic LEDs 122.

Furthermore, the monochromatic LEDs 122 are preferably blue LEDs, but the present invention is not limited thereto. The first quantum dot structure 125 includes a first transparent case 1251 and a red quantum dot phosphor 1252, and the first transparent case 1251 wraps the red quantum dot phosphor 1252. Blue light generated by the blue LED 122 excites the red quantum dot phosphor 1252 to generate red light. Likewise, the second quantum dot structure 126 includes a first transparent case 1261 and a green quantum dot phosphor 1262, and the second transparent case 1261 wraps the green quantum dot phosphor 1262. Blue light generated by the blue LED 122 excites the green quantum dot phosphor 1262 to generate green light. The blue light generated by the blue LED 122, the red light generated by exciting the red quantum dot phosphor 1252 and the green light generated by exciting the green quantum dot phosphor 1262 are mixed to generate white light.

In the present embodiment, preferably, the first transparent case 1251 and the second transparent case 1261 are both formed of transparent glass, but the present invention is not limited thereto. Hence, water and oxygen may be blocked and toxic elements in the quantum dot phosphor are prevented from leaking by encapsulating the quantum dot phosphor using the glass case, thereby enhancing security.

Moreover, the reflector cup 123 may be made of for example plastic material, but the present invention is not limited thereto, and a reflective coating layer 1231 is disposed on the inner side of the reflector cup 123. Furthermore, the encapsulating colloid 124 may be made of for example silica gel material or epoxy resin material.

In conclusion, according to embodiments of the present invention, water and oxygen may be blocked and toxic elements in the quantum dot phosphor are prevented from leaking by encapsulating the quantum dot phosphor using the glass case, thereby enhancing security. Moreover, the glass case has a small volume, and can not be broken easily and has a low fabricating cost compared with the glass tube in the related art.

Although the present invention is described with reference to specific exemplary embodiments, it will be understood by those skilled in the art that various changes in form and details may be made therein without departing from the spirit and scope of the invention as defined by the appended claims and equivalents thereof.

The invention claimed is:

1. A white light LED, comprising:
   a substrate;
   at least two monochromatic LED chips disposed on the substrate;
   a reflector cup disposed on the substrate and surrounding the monochromatic LED chips;
   an encapsulating colloid filling the reflector cup to envelop and seal the monochromatic LED chips; and
   a plurality of first and second quantum dot structures dispersed within and sealed by the encapsulating colloid such that the first and second quantum dot structures are disposed above the monochromatic LED chips and directly exposed to light generated by the monochromatic LED chips,
   wherein each of the first quantum dot structures defines a first transparent case comprising glass material and wrapping about a red quantum dot phosphor, and each of the second quantum dot structures defines a second transparent case comprising glass material and wrapping about a green quantum dot phosphor, and
   wherein light generated by the monochromatic LED chips travels through the respective transparent cases of the first and second quantum dot structures to excite the phosphor of each of the structures and to cause the first and second quantum dot structures to generate light having corresponding first and second wavelengths that are different from one another such that mixing the light generated by the first quantum dot structure and having the first wavelength with the light generated by the second quantum dot structure and having the second wavelength defines white light propagated about a top portion of the encapsulating colloid.

2. The white light LED of claim 1, wherein at least one of the monochromatic LED chips is a blue LED chip.

3. The white light LED of claim 1, wherein the reflector cup defines plastic material and includes a reflective coating layer disposed about an inner side of the reflector cup.

4. The white light LED of claim 1, wherein the encapsulating colloid defines at least one of silica gel material and epoxy resin material.

5. A backlight module, at least comprising:
   a light guide plate having a light incident side; and
   a white light LED disposed adjacent to the light incident side and configured to generate and output white light,
   wherein the white light LED includes a substrate, at least two monochromatic LED chips disposed on the substrate, a reflector cup disposed on the substrate and surrounding the monochromatic LED chips, an encapsulating colloid filling the reflector cup to envelop and seal the monochromatic LED chips, and a plurality of first and second quantum dot structures dispersed within and sealed by the encapsulating colloid such that the first and second quantum dot structures are disposed above the monochromatic LED chips and directly exposed to light generated by the monochromatic LED chips,
   wherein each of the first quantum dot structures defines a first transparent case comprising glass material and wrapping about a red quantum dot phosphor, and each of the second quantum dot structures defines a second transparent case comprising glass material and wrapping about a green quantum dot phosphor, and
   wherein light generated by the monochromatic LED chips travels through the respective transparent cases of the first and second quantum dot structures to excite the phosphor of each of the structures and to cause the first and second quantum dot structures to generate light having corresponding first and second wavelengths that are different from one another such that mixing the light generated by the first quantum dot structure and having the first wavelength with the light generated by the second quantum dot structure and having the second wavelength defines white light output about a top portion of the encapsulating colloid.

6. The backlight module of claim 5, wherein at least one of the monochromatic LED chips is a blue LED chip.

7. The backlight module of claim 5, wherein the reflector cup defines at least one of plastic material and includes a reflective coating layer disposed about an inner side of the reflector cup.

8. The backlight module of claim 5, wherein the encapsulating colloid defines at least one of silica gel material and epoxy resin material.

9. A liquid crystal display device, comprising:
   a backlight module including a light guide plate having a light incident side and a white light LED disposed adjacent to the light incident side and configured to output white light; and
   a liquid crystal display panel disposed on the backlight module,
   wherein the white light LED includes a substrate, at least two monochromatic LED chips on the substrate, a reflector cup disposed on the substrate and surrounding the monochromatic LED chips, an encapsulating colloid filling the reflector cup to envelop and seal the monochromatic LED chips, and a plurality of first and second quantum dot structures dispersed within and sealed by the encapsulating colloid such that the first and second quantum dot structures are disposed above the monochromatic LED chips and directly exposed to light generated by the monochromatic LED chips, wherein each of the first quantum dot structures defines a first transparent case comprising glass material and wrapping about a red quantum dot phosphor, and each of the second quantum dot structures defines a second transparent case comprising glass material and wrapping about a green quantum dot phosphor, and wherein light generated by the monochromatic LED chips travels through the respective transparent cases of the first and second quantum dot structures to excite the phosphor of each of the structures and to cause the first and second quantum dot structures to generate light having corresponding first and second wavelengths that are different from one another such that mixing the light generated by the first quantum dot structure and having the first wavelength with the light generated by the second quantum dot structure and having the second wavelength defines white light output about a top portion of the encapsulating colloid.

10. The liquid crystal display device of claim 9, wherein at least one of the monochromatic LED chips is a blue LED chip.

11. The liquid crystal display device of claim 9, wherein the reflector cup defines plastic material and includes a reflective coating layer disposed on an inner side of the reflector cup.

12. The liquid crystal display device of claim 9, wherein the encapsulating colloid defines at least one of silica gel material and epoxy resin material.

* * * * *